United States Patent
Ishibashi et al.

(10) Patent No.: US 7,662,239 B2
(45) Date of Patent: Feb. 16, 2010

(54) METHOD OF PRODUCING GROUP 3 NITRIDE SUBSTRATE WAFERS AND GROUP 3 NITRIDE SUBSTRATE WAFERS

(75) Inventors: Keiji Ishibashi, Hyogo (JP); Masato Irikura, Hyogo (JP); Seiji Nakahata, Hyogo (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 294 days.

(21) Appl. No.: 11/822,903

(22) Filed: Jul. 11, 2007

(65) Prior Publication Data

US 2008/0014756 A1 Jan. 17, 2008

(30) Foreign Application Priority Data

Jul. 12, 2006 (JP) ............................. 2006-191000
Dec. 15, 2006 (JP) ............................. 2006-337678

(51) Int. Cl.
*H01L 21/304* (2006.01)
*H01L 29/30* (2006.01)

(52) U.S. Cl. ................. 148/33; 438/693; 257/E21.239

(58) Field of Classification Search ................. 148/33; 438/693, FOR. 114, FOR. 391; 257/E21.239
See application file for complete search history.

(56) References Cited

U.S. PATENT DOCUMENTS

| 6,488,767 | B1 | 12/2002 | Xu et al. | |
|---|---|---|---|---|
| 6,890,779 | B2 * | 5/2005 | Toda et al. | .................. 438/22 |
| 2005/0191775 | A1 * | 9/2005 | Toda et al. | .................. 438/22 |
| 2006/0194520 | A1 * | 8/2006 | Nakayama et al. | ............ 451/42 |
| 2008/0014756 | A1 * | 1/2008 | Ishibashi et al. | ............ 438/759 |

FOREIGN PATENT DOCUMENTS

| JP | 2002-222746 | 8/2002 |
|---|---|---|
| JP | 2002-222785 | 8/2002 |
| JP | 2004-165360 | 6/2004 |
| JP | 2004-311575 | 11/2004 |

* cited by examiner

*Primary Examiner*—George Fourson
(74) *Attorney, Agent, or Firm*—McDermott Will & Emery LLP

(57) ABSTRACT

Quality of one-surface planar processed group 3 nitride wafers depends upon a direction of pasting of wafers on a polishing plate. Low surface roughness and high yield are obtained by pasting a plurality of group 3 nitride as-grown wafers on a polishing plate with OFs or notches facing forward (f), backward (b) or inward (u) with thermoplastic wax having a thickness of 10 μm or less, grinding the as-grown wafers, lapping the ground wafers, polishing the lapped wafers into mirror wafers with a bevel of a horizontal width of 200 μm or less and a vertical depth of 100 μm or less.

20 Claims, 4 Drawing Sheets

METHOD OF PRODUCING GROUP 3 NITRIDE SUBSTRATE WAFERS AND GROUP 3 NITRIDE SUBSTRATE WAFERS

RELATED APPLICATIONS

This application claims priority to Japanese Patent Application No. 2006-191000 filed Jul. 12, 2006 and Japanese Patent Application No. 2006-337678 filed Dec. 15, 2006.

BRIEF DESCRIPTION OF THE INVENTION

This invention relates to a method of sticking as-grown GaN, AlN or AlGaN substrate wafers to a polishing plate and grinding, lapping, and polishing the as-grown wafers into mirror wafers. GaN, AlN and AlGaN wafers are now collectively called "group 3 nitride" wafers. All the group 3 nitride crystals cannot be grown from liquid phase. As-grown substrate crystals of the group 3 nitrides are produced by growing a thick film on an undersubstrate in vapor phase, eliminating the undersubstrate and obtaining a freestanding wafer.

Silicon (Si) substrate wafers are rich in toughness. Grinding, lapping and polishing are easy for silicon wafers. GaN is more rigid than Si, but is more fragile than Si. GaN is subject to external shock far more than Si. GaN is endowed with chemical endurance higher than Si. It is difficult to etch GaN with alkalis or acids. Grinding, lapping and polishing of group 3 nitride substrate wafers are not done in a manner similar to silicon wafers. Grinding, lapping and polishing of group 3 nitride substrate wafers require special whetstones, whetting granules, polishing cloths, polishing liquids and so on.

There are two cases for grinding, lapping and polishing of semiconductor wafers. One is single-surface polishing (here polishing represents grinding, lapping and polishing) and the other is both-surface polishing. The present invention takes the single-surface polishing (including grinding and lapping) as an object. A one-side polishing polishes bottom surfaces of wafers by gluing object wafers on a bottom surface of a disc polishing plate (or named as a polishing holder), pushing the polishing plate on a polishing cloth of a whetting turntable, supplying a polishing liquid on the whetting turntable, rotating the polishing plate and revolving the whetting turntable. When both surfaces should be polished by the one-side polishing, the same process shall be repeated on both surfaces of the wafers by reversing surfaces.

BACKGROUND OF THE INVENTION

Production of large-sized GaN crystals is still difficult. Wide GaN substrate wafers having diameters larger than 50 mm cannot be produced at low cost with mass production. Surface planar-processing (grinding, lapping and polishing) of GaN wafers is also difficult. There are no prior art with regard to the surface planar-processing of GaN wafers. No prior references related to the surface planar-processing of GaN wafers can be cited yet.

(1) Japanese Patent Laying Open No. 2004-165360 proposed a wafer/plate-adhesion method of sprinkling a liquid wax onto a polishing plate by a spray, pushing GaAs wafers onto the plate and fixing the GaAs wafers on the plate. It was a proposal of a preliminary wafer/plate gluing method for polishing one surface of GaAs wafers. There are plenty of improvements in polishing techniques of Si substrate wafers and GaAs substrate wafers. However, there are few proposals for polishing techniques of group 3 nitride substrate wafers.

(2) Japanese Patent Laying Open No. 2002-222785 proposed a GaAs wafer/plate gluing method of sticking OF(Orientation Flat)-carrying GaAs wafers, whose OFs are cleavage planes, in directions of the OFs facing inward. The purpose of (2) is to protect weak cleavage plane OFs from excess wear-out by facing the cleavage plane OFs inward. Since rotation speeds are the least at the innermost spot of a wafer, polishing force is the weakest at the innermost of a wafer. If OF is placed at the innermost spot, the weak OF would be protected from the polishing force. Prior references (1) and (2) proposed improvements of pasting GaAs wafers on a plate. This invention relates not to GaAs but to the group 3 nitride substrate wafers. OF is not necessarily a cleavage plane in the present invention.

Circular wafers are allotted with orientation flats (OFs) or identification flats (IFs) for designating crystallographic orientation and obverse/reverse distinction.

(2) Japanese Patent Laying Open No. 2002-222785 proposed a GaAs wafer having an orientation flat (OF) that is worn out by 1.5 μm to 10 μm by polishing. When surface roughness of an obverse surface is different from that of a rear surface, the obverse/reverse surfaces can be discerned by the difference of surface roughness with human eyesight. The single orientation flat (OF) is enough to indicate crystal orientation in the case. When both surfaces have similar surface roughness and the obverse/reverse is not discriminated with eyesight, another flat is further required in addition to the orientation flat (OF) for discriminating the top/bottom and the orientation. Another flat is named here an identification flat (IF).

OBJECTS AND SUMMARY OF THE PRESENT INVENTION

Continuous endeavor has been made to produce large, good group 3 nitride crystal substrate wafers for a long time. An improvement to be mentioned as a facet growth method has enabled an HVPE method to produce wide, tall GaN crystals on GaAs undersubstrates. Eliminating the GaAs undersubstrates gives freestanding GaN substrate wafers with a 50 mm diameter (50φ). The HVPE (Hydride Vapor Phase Epitaxy) method grows group 3 nitride crystals from vapor phase. An as-grown wafer which has been just produced in vapor phase has a rugged surface on the growing side. In the case of a thick GaN ingot, a plurality of GaN wafers are obtained by slicing the thick GaN ingot in the direction vertical to the growing direction. As-grown wafers having rugged surfaces should be finished with mirror wafers through the surface planar-processing consisting of grinding, lapping and polishing. The present invention aims at proposing a method of grinding, lapping and polishing as-grown group 3 nitride substrate wafers.

Here "polishing" is sometimes used as a collective word signifying planar-processing including grinding, lapping and polishing briefly. There are two modes of polishing. One is a single-surface polishing. The other is a two-surface polishing, which polishes both surfaces simultaneously. This invention is directed to the single-surface polishing which sticks wafers on a polishing plate, pushes the polishing plate to a polishing cloth on a turntable, rotates the polishing plate, revolves the turntable and polishes the bottom surfaces of the wafers. An appropriate method of polishing is unknown yet, because GaN freestanding substrate wafers are novel themselves.

GaN is more rigid than Si. Grinding, lapping and polishing of harder GaN wafers are more difficult than the planar-processing of Si wafers. GaN wafers are more fragile than Si wafers, which makes more difficulty with the planar-processing of GaN wafers. Small GaN crystals are useless for making devices. Wide GaN wafers are available for making devices. The present invention aims at wide group 3 nitride substrate wafers with a diameter of 40 mm or more. GaN wafers with a 50 mm diameter are especially important in the present invention.

[1. Shapes and Sizes of Orientation Flat (OF) and Identification Flat (IF)]

An orientation flat is a flat edge which is produced by eliminating a bow segment from an edge of a circular wafer in order to indicate crystallographical orientation of the wafer. When a wafer has a top or bottom surface that is discernible from other features, a single orientation flat is sufficient to denote the orientation. For example, when a one-surface mirror wafer has a rugged bottom surface, the difference of surface roughness teaches the top/bottom discrimination. A one-surface mirror wafer is allotted with an OF alone. When a wafer has top/bottom surfaces that are indiscernible from other features, for example, both-surface mirror wafers, the wafer requires two different flats for designating the orientation and the obverse/reverse discrimination. A longer flat is named an orientation flat (OF). A shorter flat is named an identification flat (IF). Otherwise, OF is called a main flat and IF is called a sub flat. The eliminated parts are bow-shaped segments. OF and IF can be defined by lengths y, central angles τ or eliminated width h alternatively, since the diameter of a circular wafer is predetermined. The present invention allots a 50 mm diameter wafer with an OF and an IF of the following lengths.

Length (y) of a Side of an OF
  Allowable range: 2 mm to 30 mm
  Preferable range: 5 mm to 25 mm
Length (y) of a Side of an IF
  Allowable range: 2 mm to 20 mm
  Preferable range: 3 mm to 15 mm On an (0001) GaN wafer, OF should be determined to be a (11-20) plane and IF should be determined to be a (1-100) plane in the present invention. A cleavage plane is (1-100) in GaN, which is parallel with IF. An inequality OF>IF should be kept for the lengths of OF and IF. This is the condition for discerning OF from IF. If OF were longer than or equal to 30 mm and IF were longer than or equal to 20 mm, the effective area of products (wafers) would be too narrow. On the contrary if OF and IF were shorter than or equal to 2 mm, OF and IF would be indiscernible.

A circular wafer with a 50 mm diameter has a relation $50 \sin(\tau/2)=y$ between the side length y of an eliminated arc and the center angle τ of the arc. The abovementioned restriction can be rewritten as an equivalent restriction of center angles τ.

Center Angle (τ) of an OF
  Allowable range: 4.6 degrees to 74 degrees
  Preferable range: 11 degrees to 60 degrees
Center Angle (τ) of an IF
  Allowable range: 4.6 degrees to 47 degrees
  Preferable range: 6.9 degrees to 35 degrees The width h of an eliminated arc has a relation $h=50(1-\cos\{\tau/2\})$ with the center angle τ of the arc in a 50 mm diameter circular wafer. The abovecited restrictions can further be rewritten as a restriction imposed on the eliminated arc width (h).

Eliminated Width (h) of an OF
  Allowable range: 0.04 mm to 10 mm
  Preferable range: 0.25 mm to 6.7 mm
Eliminated Width (h) of an IF
  Allowable range: 0.04 mm to 4.15 mm
  Preferable range: 0.09 mm to 2.31 mm

[2. Notch and Notch Size]

Instead of OF and IF, notches are sometimes cut on an edge of a circular wafer. When the top/bottom can be discerned with eyesight, a single notch is marked. When the top/bottom cannot be discerned, two different notches are required. FIG. 2 shows an example of a wafer having notches N1 and N2.

Depth of a Notch
  Allowable range: 2 mm to 10 mm
  Preferable range: 3 mm to 8 mm
Angle of a Notch
  Allowable range: 30 degrees to 120 degrees
  Preferable range: 40 degrees to 90 degrees In the case of wafer obverse/reverse marking, two notches are required to distinguish top and bottom surfaces. A main notch N1 and a subnotch N2 should be discerned. The main notch N1 should be deeper than the subnotch N2. Namely N1>N2 in depth. If the depths of the notches N1 and N2 were more than or equal to 10 mm and the angles of the notches N1 and N2 were more than or equal to 120 degrees, effective area of products (wafers) would be too narrow. When the depths and angles of the notches N1 and N2 were less than or equal to 2 mm and 30 degrees respectively, the notches would be indiscernible.

[3. Bevel]

Bevel denotes a blunt inclination of an edge of a wafer which is caused by grinding, lapping and polishing. Elastic deformation of a polishing cloth wears out a sharp peripheral edge into a blunt slant and lowers the peripheral edge. As shown in FIG. 4, the size of a bevel is represented by two components (e) and (g). One is a horizontal (width) component (e). The other is a vertical (depth) component (g). The bevel is an obstacle to devices made on the wafer by photolithography, since the surface is not flat at the periphery. Bevels are invited by a plurality of causes in the course of the surface processing (grinding, lapping and polishing). Many causes for incurring bevels are thought, for example, skew of a shaft of a whetting turntable, worn-out of polishing cloths, non-uniform flow of a polishing liquid, inappropriate process conditions in grinding, lapping and polishing machines and so on.

Allowable and preferable bevels are now clarified.
Allowable bevels: horizontal width (e) less than or equal to 200 μm
  vertical depth (g) less than or equal to 100 μm
Preferable bevels: horizontal width (e) less than or equal to 100 μm
  vertical depth (g) less than or equal to 50 μm When the bevel width (e) is in exceed of 200 μm in the horizontal direction and the bevel depth (g) is in exceed of 100 μm in the vertical direction, the loss of the effective area of the wafer is too large. Such a big loss should be avoided. A polishing (including grinding and lapping) for reducing the bevel width (e) and depth (g) within the allowed scope of $e \leq 200$ μm and $g \leq 100$ μm is required.

[4. Paste of a Wafer to a Polishing (Including Grinding and Lapping) Plate]

There are two types of polishing machines. Here polishing is a collective concept including grinding and lapping. One is a single-surface polishing machine, which polishes only one surface of wafers. The other is a both-surface polishing machine, which polishes both surfaces at a stroke. This invention is related to an improvement of the single-surface polishing. The single surface polishing requires an operator to paste an object wafer to a polishing plate.

For example, a hot-melting type adhesive (wax) is employed for pasting a wafer to a polishing plate. The hot-melting type adhesive means such an adhesive that is softened by heating and is solidified by cooling. A wafer is stuck to a polishing plate by heating the plate, rubbing the plate with the hot-melting type adhesive, pasting a wafer on the adhesive-painted plate and cooling the plate. The hot-melting type adhesive is sometimes called a thermoplastic wax. The thermoplastic wax includes paraffine as a main component.

The wax is heated up and molten at a temperature of Tm+20° C. to Tm+50° C., where Tm is a softening temperature of the wax, and Tm+20° C. is a temperature of Tm plus 20° C. Wax is actually painted on a bottom surface of a polishing plate by heating the plate up to a temperature between Tm+20° C. and Tm+50° C. and rubbing the hot plate with a solid wax by hand or painting a liquidized wax with brush. Wax is molten and is extended on the plate. When the wax is heated at a temperature of Tm+20° C. or below, adhesion of the wax is insufficient. When the wax is heated at a temperature of Tm+50° C. or above, excess high fluidity of the wax degenerates adhesive thickness uniformity and degrades shape accuracy of polished wafers. Thus the preferable scope of the pasting temperature ranges from Tm+20° C. to Tm+50° C.

The thickness of the wax sandwiched between the polishing plate and the wafer should be 0.5 μm to 10 μm. A more suitable range of the wax thickness is 1 μm to 5 μm. An operator paints the polishing plate with the heated, softened wax by a brush or sprays liquidized wax on the polishing plate. The operator pastes wafers to the polishing plate by pushing the wafers on the wax coated plate. Pushing sometimes causes deformation of wafers due to air bubbles remaining. It is preferable to make a vacuum and eliminate air bubbles from the wax for suppressing the wafers from deforming. The reason why the wafers are glued to the polishing plate with the wax is that the wax painting is feasible for operation and the wax is excellent in adhesion strength.

[5. Fluctuation of Wax Thickness]

Inter-wafer fluctuation of the wax thickness among different wafers stuck to the same polishing plate should be less than or equal to 7 μm. A preferable range of the inter-wafer fluctuation of the wax thickness is 1 μm to 5 μm. When there are wax thickness differences among the wafers glued on the same polishing plate, the thicknesses eliminated are also different among the wafers. The polished wafers have differences in thickness. A wax thickness fluctuation more than or equal to 7 μm should be forbidden, because the over 7 μm wax fluctuation causes serious fluctuation of wafer thicknesses. Distribution of wax thicknesses can be measured by a dial guage. The dial guage is a device of measuring the thickness of an object. When the initial distribution of wafer thicknesses has been measured, the wax thickness distribution can be obtained by the measurement with the dial guage.

In-wafer fluctuation of the wax thickness within a wafer should be 5 μm or below. Preferably the in-wafer wax thickness fluctuation should be 3 μm or less. The wax thickness fluctuation is transcribed to the thickness fluctuation of the wafers after grinding, lapping and polishing. The wax thickness fluctuation of more than 5 μm induces large wafer thickness fluctuation and a large TTV (Total Thickness Variation) after grinding, lapping and polishing. In brief, a wafer after grinding is called a "postgrind" wafer. A wafer after lapping is called a "postlap" wafer hereafter. A wafer after polishing is called a "postpolish" wafer. A postpolish wafer is called a "mirror wafer", since the polished surface is flat and smooth like a mirror. More than 5 μm wax thickness fluctuation inhibits photolithography from depicting a correct pattern on the postpolish wafer.

The postpolish wafers are removed from the polishing plate by heating the polishing plate, melting the wax and separating the wafers from the polishing plate. Otherwise, the postpolish wafers are separated by a sharp blade from the polishing plate. Another method for separation is to solve the wax with isopropyl alcohol or other organic solvents and to peel the wafers off the polishing plate.

[6. Directions of Pasting Wafers on a Plate]

The direction of OFs or notches of wafers glued on a polishing plate is important. The OF (or notch) direction is a main problem of the surface planar processes of the present invention. When two flats or two notches are assigned, the larger flat or the larger notch is taken into consideration hereafter. The OF (or notch) direction has a great influence upon the result of the surface planar processes (grinding, lapping and polishing). If a wafer has an OF and an IF, the larger OF should be taken into account for determining the wafer direction on the plate.

FIG. 5 denotes a bottom view of a polishing plate 6 and wafers W1, W2, W3 and W4 glued on the polishing plate 6. Directions are defined with the rotation direction (arrow) of the polishing plate 6. When the plate 6 rotates, an angular direction in which the plate 6 runs is named forward (f). Another direction from which the plate 6 separates is named backward (b). A centripetal radial direction from a wafer toward the plate center is named inward (u). A centrifugal radial direction from the plate center toward wafers is named outward (s). The result of surface planar-processing depends upon the OF direction on the plate. In FIG. 5, all the four wafers have OFs facing outward (s). This is the worst direction of OFs. OF-outward facing (s) incurs bad results. This invention denies the outward facing OF. This invention favors inward (u), backward (b) and forward (f). When a wafer has two flats (OF, IF) or two notches (N1, N2), both marks should not face outward (s). Wafer surface planar-processing includes grinding, lapping and polishing. The three processes should be discriminated.

Grinding, lapping and polishing are three different processes for wafer surface planar-processing. Hitherto sometimes the word "polishing" is used as a collective concept for representing three different processes. Grinding is a step of roughly rubbing wafer surfaces with gross fixed whetting granules. Grinding eliminates large ruggedness, produces a flatter wafer surface and reduces a wafer thickness into a predetermined scope of thickness. Grinding is fastest in the speed of reducing a wafer thickness.

Lapping employs either free whetting granules or fixed whetting granules. In the case of fixed whetting granules, the granules of lapping are smaller than the whetting granules of grinding. Lapping further reduces surface ruggedness and eliminates grinding-induced degenerated superficial layers.

Polishing, which uses free whetting granules, is the final step of the planar-processing steps. Polishing aims at decreasing surface roughness and removing grind/lapping-induced degenerated superficial layers. A polishing machine processes wafers glued on the polishing plate by supplying the wafers with a polishing liquid, rubbing the surfaces of the wafers with a whetting cloth and polishing the surfaces with fine free granules. Free granules are exchanged from larger sized granules via medium sized granules to fine sized granules at several steps. Surface evenness of wafers is increased step by step.

In every step of grinding, lapping and polishing, OF-outward facing (s) of the wafers W1, W2, W3 and W4 is bad. The OF-outward facing (s) induces cracks, deep scars and damage on the wafers in the grinding step. The OF-outward facing (s)

causes bruises and increase roughness on the wafers in the lapping step. The OF-outward facing (s) invites an increment of surface roughness and deep bevels (blunt edge slanting) on the wafers in the polishing step.

As shown in FIG. 6, wafers should be pasted on the polishing plate in the directions in which the orientation flats OF should not face outward (s). In FIG. 6, W5's OF faces forward (f). Forward (f) facing OF does not induce a large bevel. W6's OF faces inward (u). W7's OF faces inward (u). Inward (u) facing is also good. W8's OF faces backward (b). Backward (b) facing does not cause a big bevel. It is not necessary to equalize the OF-facing of all the wafers in a lot. It is important to paste wafers in the directions of facing the OFs backward (b), forward (f) or inward (u). Outward facing (s) is forbidden in the present invention.

OF's outward facing (s) of wafer directions induces a large bevel in polishing steps. The reason why the OF outward facing (s) invites a big bevel has not clearly been known yet by the inventors. OF outward facing (s) is assumed to reduce the effective diameter of pasted wafers due to the width of the orientation flats OF. Reduction of the effective contacting diameter will induce a sway motion in the polishing plate. OF outward facing (s) increases the pressure of the polishing cloth at the orientation flat (OF). Excess pressure will probably force grinding to cause scars and damage, lapping to increase surface roughness and polishing to cause bevels. Otherwise, OF outward facing (s) may induce disadvantageous flow in a polishing liquid or unfavorable deformation in a polishing cloth.

The degree of OF-direction induced differences of qualities in grinding, lapping and polishing processes depends on the size of the OF. An OF length of more than or equal to 11 mm ($y \geq 11$ mm) invites conspicuous differences due to the difference of the OF-directions.

[7. Positions of Pasting Wafers on a Polishing Plate]

Another important matter is the positions of pasting wafers on a polishing plate. In the case of three or more wafers, the centers of the wafers should be determined to be set at points out of a half of the radius of the polishing plate. It will be explained by referring to FIG. 7, which shows an example of determining the pasting position of wafers. (G) is the center of a polishing plate 6. An edge circle of the polishing plate 6 is denoted by (q). The radius of the polishing plate 6 is denoted by (r). A half circle (v) (dotted line) is defined as a circle having the center G and a radius (r/2) which is a half of the plate radius (r). The half circle (v) is concentric with the plate edge circle (q) of the polishing plate 6. Centers of the wafers W9, W10 and W11 are denoted by C9, C10 and C11. The wafer centers should be out of the half circle (v). Namely the wafers should be allocated on the plate 6 under the conditions of $GC9 > r/2$, $GC10 > r/2$ and $GC11 > r/2$.

A wafer circle (c) is defined as a circle passing the centers C9, C10 and C11 of the wafers W9, W10 and W11. The wafer circle (c) has a center at (G). The wafer circle (c) is concentric with the plate edge circle (q). The above conditions can be rewritten that the wafer circle (c) should be larger than the half circle (v). The outer wafer fixation condition stabilizes the rotation of polishing plate during the processing and improves the performance of the surface planar-processing.

Beside the above outer wafer fixation condition, there is a further restriction on the wafer positions. An inner contact circle (j) (double dotted line) is defined as a circle being in contact with inner sides of the wafers W9, W10, and W11. The radius of a wafer is denoted by "w". The diameter of the inner contact circle (j) is denoted by J. The other restriction is that the diameter J of the inner contact circle (j) should be larger than or equal to a length which is 0.35 times as long as the wafer diameter 2w. Namely $J \geq 0.7w$ should be maintained. More favorably, the diameter J of the inner contact circle (j) should be longer than or equal to another length which is 0.4 times as long as the wafer diameter 2w. The more favorable condition is $J \geq 0.8w$. If the inner contact circle (j) were too narrow, the flow of a polishing liquid would be stagnated within the inner contact circle (j). Non-uniform flow of the polishing liquid would induce non-uniform grinding, lapping and polishing in the wafers. Thus the above inner restriction $J \geq 0.7w$ (more favorably $J \geq 0.8w$) is imposed upon the position of the inner sides of the wafers on the polishing plate.

An outer limit of the wafer pasting positions is given by the following consideration. As shown in FIG. 7, the outer margin (p) between outermost sides of wafers and the plate edge (q) should be more than or equal to 1 mm ($p \geq 1$ mm). An outer contact circle (k), which is in contact with outer sides of wafers W9, W10 and W11, is depicted as a double-dotted circle in FIG. 7. K denotes a diameter of the outer contact circle(k) ($p = r - K/2$). The above means $K/2 + 1$ mm $\leq r$. If the outer side of wafers were too close to the plate edge (q), the supply of a polishing liquid to the outer side of wafers would be insufficient and the outer sides would not be fully polished. Insufficient polishing of outer sides would be serious, in particular, when the polishing plate is confined within a guide-ring. The wafers should be pasted at inner points which are distanced from the plate edge (q) by at least 1 mm. On the contrary, if wafers were stuck at too inner points, the previous inner contact circle (j) condition would not be satisfied. The margin (p) should have a preferable range of 3 mm $\leq p \leq 8$ mm.

[8. More Than One Circle Allotment of Wafers]

When the size of wafers is small enough or the size of the plate is large, wafers can be pasted along more than one concentric circle of a polishing plate. FIG. 8 shows an example of two concentric circle allocation of wafers on a polishing plate. An inner wafer circle with a radius M and an outer wafer circle with a radius N are assumed concentrically on the polishing plate. Wafers W12, W13, W14, W15 and W16 (inner circle group) are stuck along the inner wafer circle to the polishing plate with an equal distance M to the center. Wafers W17, W18, W19, W20 and W21 (outer circle group) are stuck along the outer wafer circle to the polishing plate with an equal distance N to the center. $M < N < r$. What is important is that the inner circle group wafers should not align with the outer circle group wafers in radial directions. Preferably, the inner circle group wafer W13 should be laid on a bisector of a top angle of an isosceles triangle which is formed by connecting centers of the neighboring outer circle wafers W21 and W17 to the plate center G. W13 is pasted on a bisector of $\angle W21GW17$ in FIG. 8. The same relation should be maintained among other sets of the inner/outer group wafers. Such an allocation can equalize gaps between neighboring wafers. Uniform distribution of gaps forms uniform flow of polishing liquids on the polishing cloths. Uniform distribution of wafers equalizes the pressure acting on the wafers from the polishing cloth. Uniform pressure and uniform liquid flow bring stable rotation and low vibration of the polishing plate and the polishing turntable.

[9. Inner Structure of Group 3 Nitride Wafers]

This invention is available for groups 3 nitride wafers with uniform property without inner structure. In addition to the uniform wafers, this invention is also applicable to groups 3 nitride wafers with non-uniform property with inner structure. This invention allows object nitride wafers to have a stripe structure. Such a stripe structure is inherent to nitride wafers. There are neither stripe structure Si wafer nor stripe structure GaAs wafer. The stripe structure is a special structure which appears on group 3 nitride crystal substrates by a particular method. A striped wafer means an anisotropic wafer having repetitions of parallel parts extending in a direction. Parallel sets of a linear dislocation accumulating region having many dislocations and a linear low defect single crystal region having a few dislocations align in the direction vertical to the extension.

The facet-growth method enables the inventors to produce a freestanding low dislocation density GaN substrate wafer with a 50 mm diameter. The facet-growth method is a novel method of making a rugged, facetted surface of growing film, growing the film with the facetted surface in vapor phase and maintaining the facetted surface till the end. For example, a stripe mask or dot mask is formed on an undersubstrate. A nitride film is grown on the mask-carrying undersubstrate in vapor phase. Plenty of pits or valleys composed of facets are produced on the growing surface due to the mask. When the facet pits or facet valleys are maintained without being buried, differences between horizontal and vertical growing speeds bring dislocations on facets into bottoms of the facet pits or the valleys. High concentration of dislocations is accumulated at the bottoms of the facet pits. Dislocations are removed from other regions, since dislocations are pulled, gathered and arrested at the bottoms of the pits. Other regions than the bottoms or valleys become nearly immune from dislocations. Other regions have low dislocation density. The facet growth is effective in decreasing dislocation density in the other regions except the pits or valleys. The stripe mask facet growth is convenient for fabricating devices due to simple correspondence of the device allocation to the on-wafer position.

An orientation flat (OF) or a notch is made at a point on a circle edge of a group 3 nitride circular wafer for indicating orientation. In which direction the OF or notch is cut exercises an influence upon the result of the planar-processing (grinding, lapping and polishing). The present invention pastes group 3 nitride wafers with a thermoplastic wax of a thickness less than or equal to 10 μm on a polishing plate with OFs (or notches) facing forward (f), inward (u) or backward (b) with regard to the rotation direction. This invention can make mirror wafers with low surface roughness and small bevels.

The present invention enables the surface planar wafers to make epitaxial layers endowed with excellent crystallography and morphology and to make devices excellent in quality and yield.

DESCRIPTION OF PREFERRED EMBODIMENTS

Embodiment 1

Figure 1:
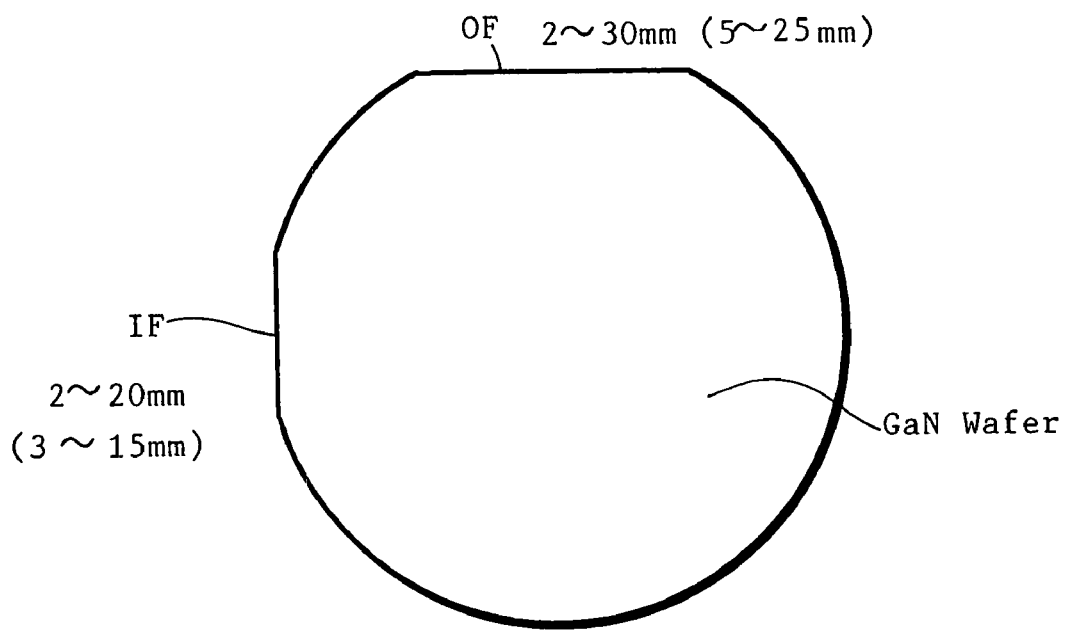
FIG. 1 is a plan view of a GaN wafer having an orientation flat (OF) and an identification flat for indicating the orientation and obverse/reverse distinction.
Figure 2:
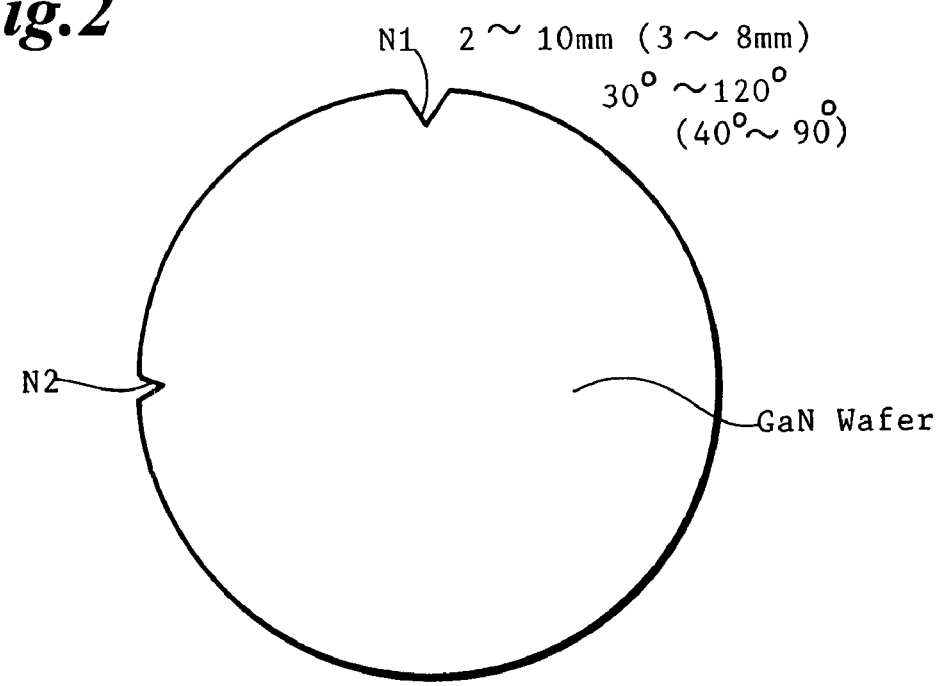
FIG. 2 is a plan view of a GaN wafer having a first notch (N1) and a second notch (N2) for indicating the orientation and obverse/reverse distinction.
Figure 3:
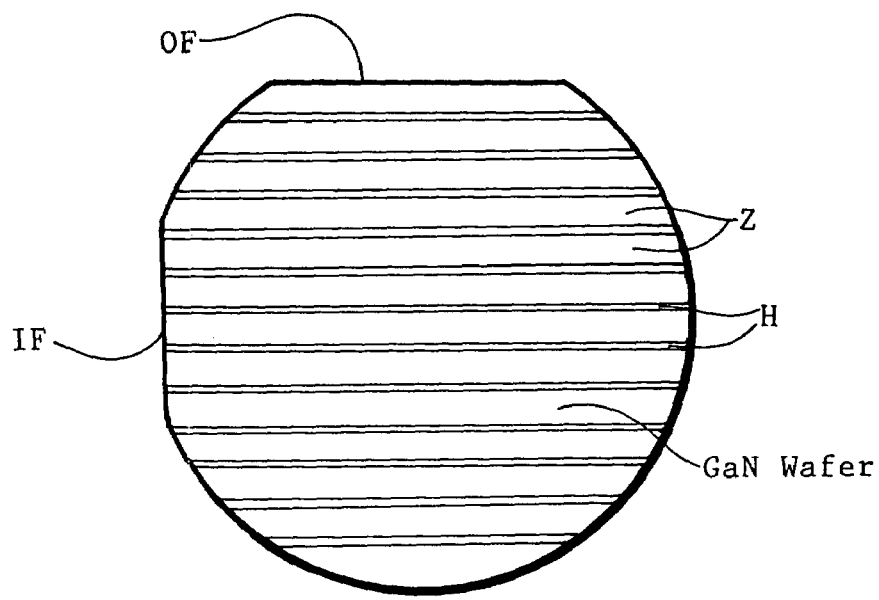
FIG. 3 is a plan view of a GaN wafer which has been grown by a stripe facet method and has sets of parallel alternate stripes of low defect single crystal regions (Z) and defect accumulating regions (H) with an orientation flat (OF) cut in parallel with Hs and Zs and an identification flat (IF) shorn vertically to Hs and Zs.

A polishing plate of an alumina ($Al_2O_3$) disc with a 135 mm diameter and a 30 mm thickness is prepared. Sample wafers of grinding, lapping and polishing are HVPE as-grown GaN circular wafers with a 50 mm diameter and a 0.5 mm thickness. An as-grown GaN ingot is obtained by growing a GaN crystal on a GaAs undersubstrate and eliminating the GaAs undersubstrate. A plurality of as-grown GaN substrate wafers are produced by slicing the GaN ingot by a wire-saw. Each as-grown wafer has an orientation flat (OF) of a 16 mm length. The central angle (τ) of OF is 18 degrees. The eliminated width h for OF is 0.6 mm. Each sample is a set of three as-grown wafers with an OF.

Three as-grown GaN wafers are pasted on the bottom of a polishing plate by heating the polishing plate up to a temperature of Tm+30° C., rubbing the bottom of the polishing plate with a thermoplastic solid wax, softening the wax, placing as-grown wafers at spots with a 5 mm margin p (p=5 mm) from the plate edge and pressing the as-grown wafers to the polishing plate.

TABLE 1

|  | Sample 1 | Sample 2 | Sample 3 | Sample 4 |
| --- | --- | --- | --- | --- |
| OF facing | inward u | forward f | backward b | outward s |
| In-wafer wax thickness fluctuation | 3 μm | 3 μm | 2 μm | 2 μm |
| Inter-wafer wax thickness fluctuation | 5 μm | 5 μm | 4 μm | 3 μm |
| Substrate thickness fluctuation | 7 μm | 8 μm | 6 μm | 6 μm |
| Postlap surface roughness (Rms) | 2.4~3.2 nm | 2.2~3.6 nm | 2.5~3.4 nm | 2.3~4.8 nm |
| Postpolish surface roughness (Rms) | 1.2~1.5 nm | 1.2~1.8 nm | 1.3~1.7 nm | 1.4~2.6 nm |
| Postlap bevel width (A) | <10 μm | <10 μm | <10 μm | <10 μm |
| Postlap bevel depth (B) | <10 μm | <10 μm | <10 μm | <10 μm |
| Postpolish bevel width (A) | 140 μm | 170 μm | 90 μm | 360 μm |

TABLE 1-continued

|  | Sample 1 | Sample 2 | Sample 3 | Sample 4 |
|---|---|---|---|---|
| Postpolish bevel depth (B) | 43 μm | 72 μm | 30 μm | 120 μm |
| LED yield | 60% | 52% | 68% | 38% |

※ Bevel
A: horizontal direction
B: vertical direction

Four samples of sets of three as-grown wafers are ground, lapped, polished and examined. Each Sample consists of three wafers. All the three wafers belonging to the same Sample are glued on the plate in the same facing u, f, b or s.

When the wafers are glued on the polishing plate, the wax thickness distribution is calculated by measuring the wax thickness ξ of the wafers. An in-wafer wax distribution is the maximum of the differences ($ξ_{max}-ξ_{min}$) by subtracting the minimum wax thickness ($ξ_{min}$) from the maximum wax thickness ($ξ_{max}$) within each wafer glued on the plate. Samples 1, 2, 3 and 4 have in-wafer wax distributions of 3 μm, 3 μm, 2 μm and 2 μm respectively.

An inter-wafer wax distribution is a difference ($ξ_{max}-ξ_{min}$) by subtracting the minimum wax thickness ($ξ_{min}$) from the maximum wax thickness ($ξ_{max}$) within all the wafers glued to the same plate. Samples 1, 2, 3 and 4 have inter-wafer wax distributions of 5 μm, 5 μm, 4 μm and 3 μm respectively.

Samples 1, 2, 3 and 4, each of which consists of three wafers glued on a polishing plate, are ground, lapped and polished. A diamond whetting turntable which has fixed diamond whetting granules grinds the Samples. A metallic whetting turntable, which has a flat metallic surface, laps the Samples with supplying a polishing liquid including diamond free whetting granules. A resin-polishing pad carrying turntable polishes the Samples with supplying another polishing liquid including free colloidal silica granules.

A photointerference roughness tester examines surface roughness Rms of the postlap GaN wafers. Here, a "postlap" wafer means a wafer which has experienced the lapping step. Five points are employed for examining Rms. Five examination points correspond to a center and four corners of an imaginary square having a center coinciding with the center of the wafer. Ranges of measured Rms at the five examination points are listed on Table 1. Table 1, line 6 denotes the ranges of Rms measured at five points on postlap Samples 1-4.

Postlap Sample 1 indicates surface roughness of Rms 2.4 nm to Rms 3.2 nm.

Postlap Sample 2 reveals surface roughness of Rms 2.2 nm to Rms 3.6 nm.

Postlap Sample 3 shows surface roughness of Rms 2.5 nm to Rms 3.4 nm.

Postlap Sample 4 denotes surface roughness of Rms 2.3 nm to Rms 4.8 nm.

Sample 4 shows the largest Rms after lapping.

Bevels of the postlap GaN wafers are measured. A bevel means an inclining round edge caused by polishing. Since photolithography depicts patterns on a wafer by light, it is ideal that the wafer should be flat till the peripheral edge. Edge bevels will cause deformation of patterns at the periphery of the wafer. Bevel is estimated by a horizontal width A, which is a vertical projection of the bevel on a horizontal plane, and a vertical depth B, which is a horizontal projection on a vertical plane. The size of a bevel is expressed by a bevel width A and a bevel depth B.

Figure 4:
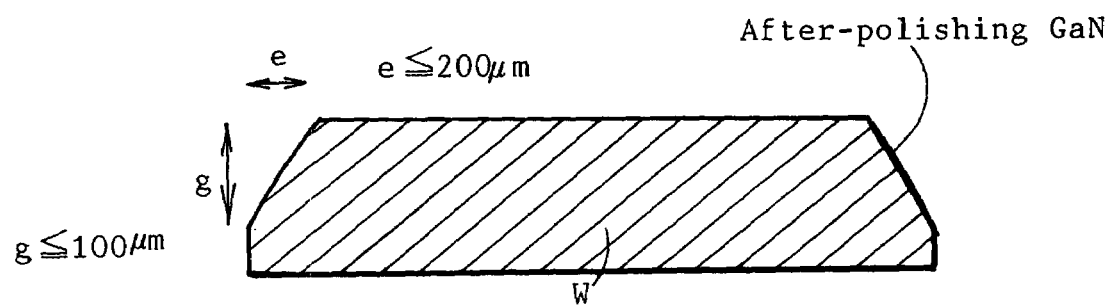
FIG. 4 is a sectional view of an after-polishing GaN wafer for showing the bevels caused by polishing.
Figure 5:
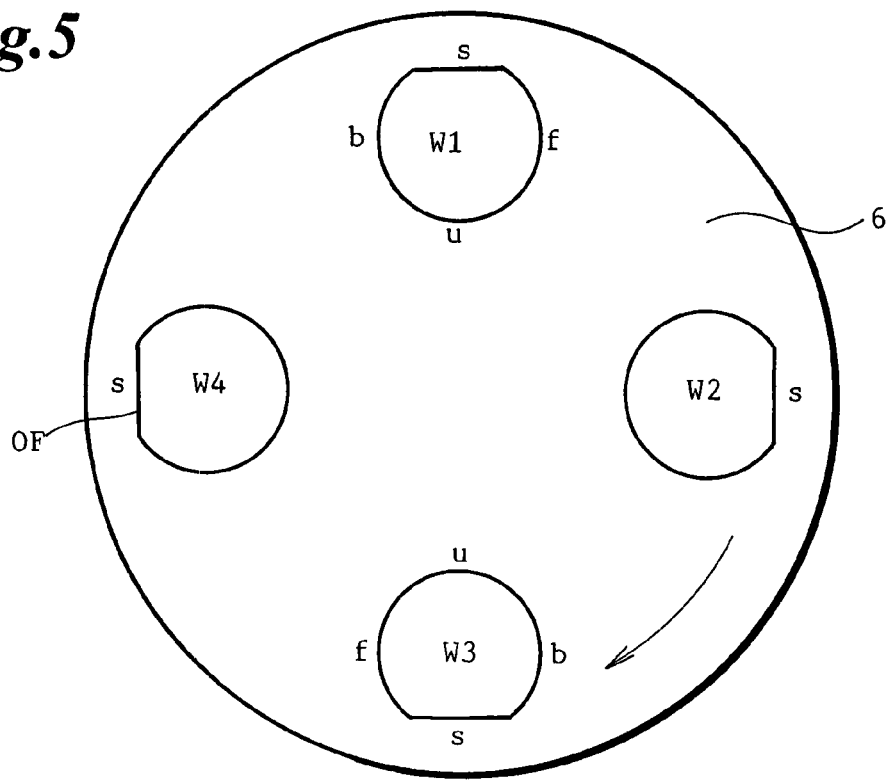
FIG. 5 is a plan view of a polishing plate and wafers W1, W2, W3 and W4 stuck on the polishing plate with outward-facing (s) OFs, wherein facing of orientation flats (OFs) of the stuck wafers is classified into forward (f), inward(u), backward (b) and outward (s) facing defined in the rotation direction of the plate.
Figure 6:
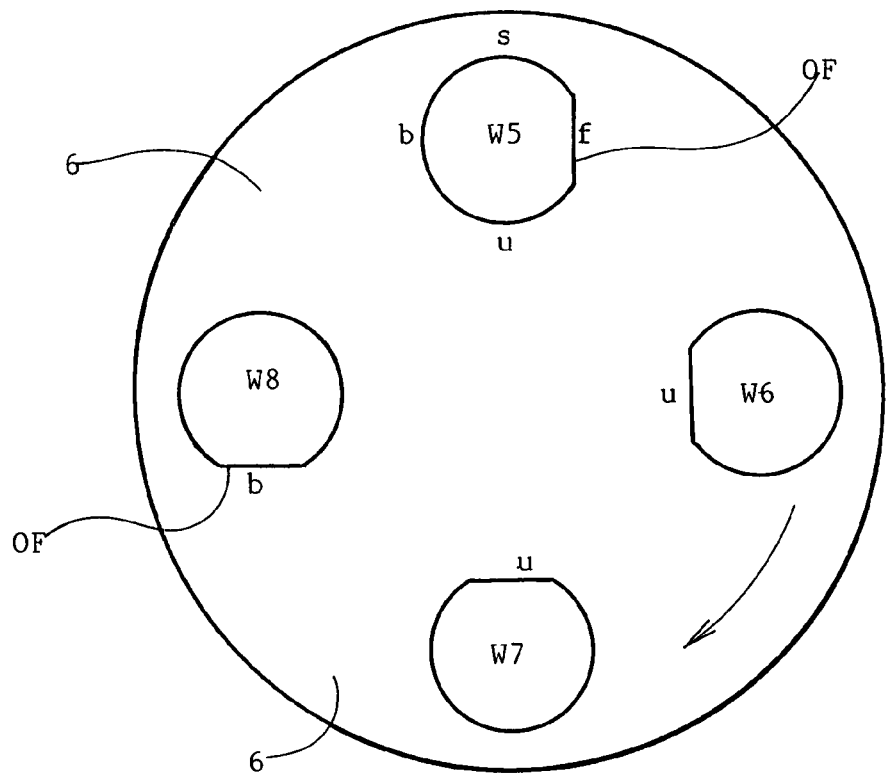
FIG. 6 is a plan view of a polishing plate and a variety of OF-facing of wafers. The OF-facing refers to the angular rotation direction of the plate. W5 is a forward-facing (f) wafer. W6 is an inner-facing (u) wafer. W7 is an inner-facing (b) wafer. W8 is a backward-facing wafer.
Figure 7:
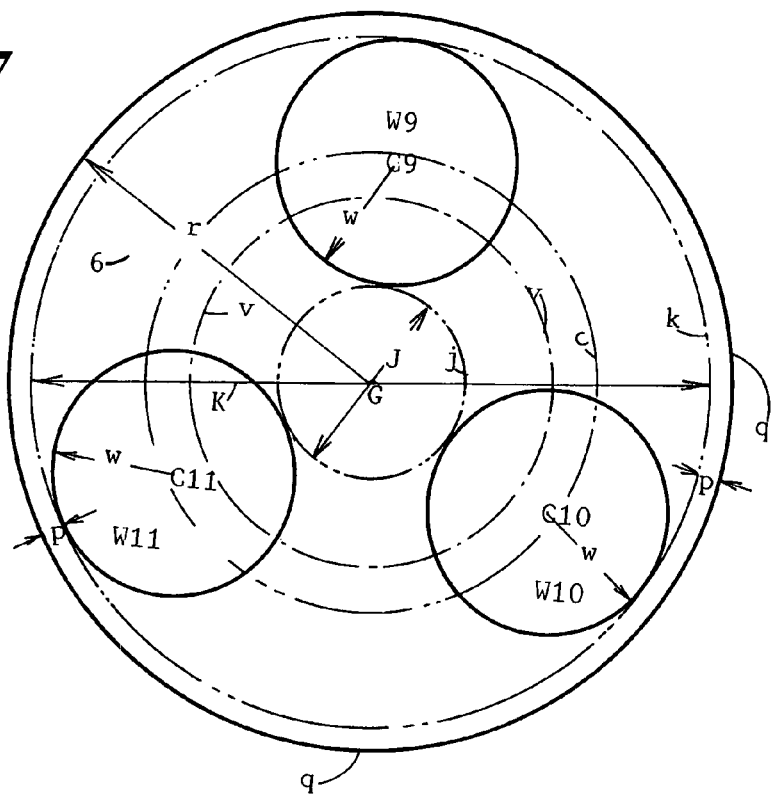
FIG. 7 is a plan view of a polishing plate and wafers stuck to the polishing plate on a single circle for demonstrating preferable positions of the sticking wafers.
Figure 8:
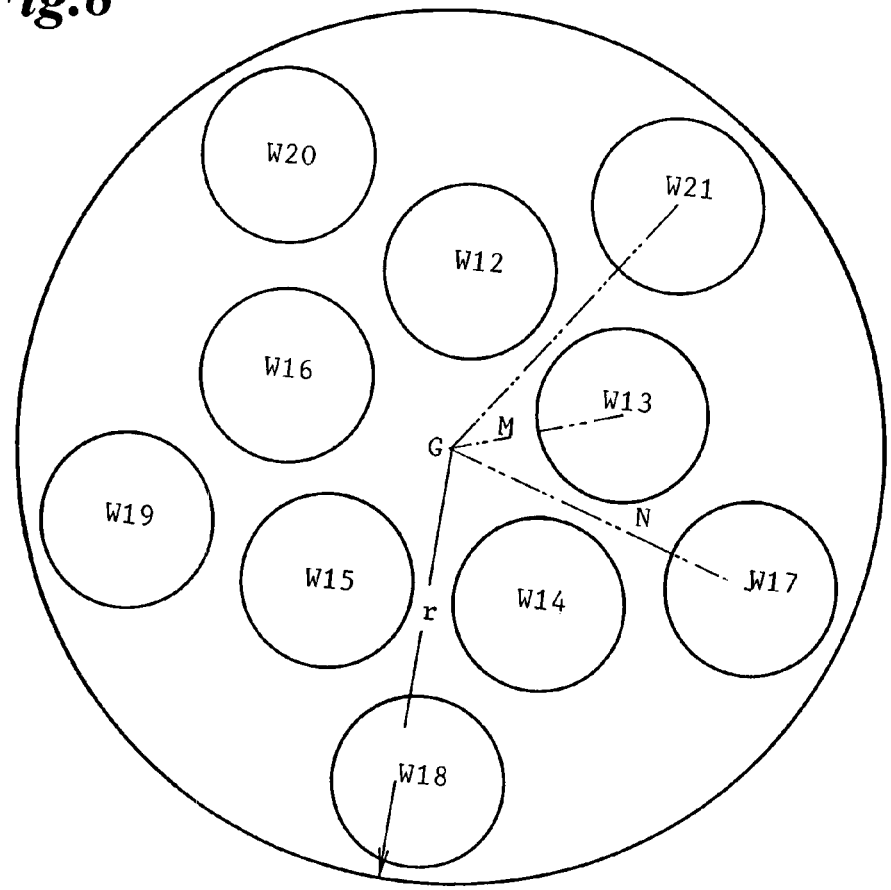
FIG. 8 is a plan view of a polishing plate and wafers stuck to the polishing plate on double circles for demonstrating preferable positions of the sticking wafers.

The concept of the bevel is clarified by referring to FIG. 4. In FIG. 4, the edge slants are bevels. The horizontal width A is e. The vertical depth B is g. Postlapping bevel widths A of Samples 1, 2, 3 and 4 are all less than 10 μm, as shown in Table 1. The postlapping bevel depths B are also less than 10 μm.

The above relates to the postlap wafers which have been lapped but have not been polished yet. Then the lapped GaN wafers are polished into mirror wafers. Hereafter postpolish (mirror) wafers are described. Surface roughness Rms of the postpolish wafers is measured at five points, one center point and four peripheral points. The five examination spots correspond to a center and four corners of a square supposed on the wafer. Measured roughness of the postpolish Sample 1 is Rms 1.2 nm to Rms 1.5 nm at the five points, as listed in Table 1.

Measured roughness of the postpolish Sample 2 is Rms 1.2 nm to Rms 1.8 nm.

Measured roughness of the postpolish Sample 3 is Rms 1.3 nm to Rms 1.7 nm.

Measured roughness of the postpolish Sample 4 is Rms 1.4 nm to Rms 2.6 nm.

Sample 4 is the largest also in four Samples 1-4 with regard to the postpolish roughness.

Polishing enlarges bevels because elastic resin pads press the surfaces of wafers and deformed pads wear out the edges of wafers. Postpolish bevels of the wafers of Samples 1-4 after polishing are measured. Sample 1 shows a 140 μm postpolish bevel width A and a 43 μm postpolish bevel depth B. Sample 2 shows a 170 μm postpolish bevel width A and a 72 μm postpolish bevel depth B. Sample 3 denotes a 90 μm postpolish bevel width A and a 30 μm postpolish bevel depth B. Sample 4 shows a 360 μm postpolish bevel width A and a 120 μm postpolish bevel depth B.

An increase of a vertical bevel B causes an increment of a horizontal bevel A. Sample 4 has a large vertical bevel B and horizontal bevel A. Sample 4 has wafers having outward (s) facing OFs. Large surface roughness and big bevel accompany the wafers with outward (s) facing OFs on the polishing plate.

Wafer thickness fluctuation is defined as a difference of thicknesses of wafers glued on a polishing plate. In the concrete, the wafer thickness fluctuation is a difference by subtracting the minimum wafer thickness from the maximum wafer thickness. Large wafer thickness fluctuation of the postpolished wafers indicates poor polishing. Sample 1, 2, 3 and 4 show wafer thickness fluctuation of 7 μm, 8 μm, 6 μm and 6 μm respectively. The standard thickness of the wafers is 500 μm.

Light emitting diodes (LEDs) are fabricated by epitaxially growing an n-GaN layer, an InGaN layer and a p-GaN layer on the mirror wafers of Samples 1-4. The LEDs are examined and are classified into approved products and rejects. The yield, which is a ratio of approved/total products, is shown on the Table 1 for Sample 1-4. A 50 mm diameter wafer can make about 2000 LEDs with a 400 μm square.

LED yields of Samples 1-4 are 60%, 52%, 68% and 38%. Sample 4, which is annoyed with a large bevel and large postpolish surface roughness Rms, has a drawback of a low LED yield.

Embodiment 2

Embodiment 2 employs a polishing plate of an alumina (Al$_2$O$_3$) disc with a 155 mm diameter and a 30 mm thickness. Object GaN wafers of grinding, lapping and polishing processes are sets of stripe structure HVPE-as-grown GaN wafers with a 50 mm diameter and a 0.5 mm thickness. The stripe structure means a non-uniform GaN crystal having reciprocally alternating sets of parallel low density single crystal regions and parallel defect accumulating regions. The stripe structure GaN wafers have been made by preparing a GaAs undersubstrate, producing a stripe mask on the GaAs undersubstrate, growing a GaN film crystal on the stripe-masked undersubstrate by an HVPE method, producing facets and maintaining the facet till the end. HVPE-as-grown GaN/GaAs complex wafers are made. An as-grown GaN freestanding wafer is obtained by removing the GaAs undersubstrate and chamfering an edge. Otherwise if a tall GaN crystal is grown on a GaAs undersubstrate for a long time by the HVPE method, a plurality of freestanding GaN wafers are made by vertically slicing the GaN ingot with a wire-saw into a plurality of as-grown GaN wafers. Five as-grown GaN wafers are chosen as a set of sample wafers for grinding, lapping and polishing at a lot. A notch is allotted to an edge of each GaN wafer for indicating orientation. The notch has a 5 mm depth and a 60 degree angle. Five as-grown GaN wafers are glued with a thermoplastic solid wax on a polishing plate. The polishing plate is heated up to Tm+30° C., where Tm is the softening temperature. An operator pastes five GaN wafers by rubbing the hot polishing plate with the thermoplastic wax by hand, allowing molten wax to extend on the plate, placing GaN wafers on the molten wax at points having a margin of 6 mm (p=6 mm) from the plate edge and pressing the GaN wafers to the plate.

Surface processing steps (grinding, lapping and polishing) are done to four Samples 5, 6, 7 and 8. Table 2 shows results. The directions of the notches on the polishing plate are denoted in Table 2. All the five wafers belonging the same Sample have common facing of notches.

Notches of five GaN wafers of Sample 5 face inward (u).
Notches of five GaN wafers of Sample 6 face inward (u).
Notches of five GaN wafers of Sample 7 face backward (b).
Notches of five GaN wafers of Sample 8 face backward (b).

Wax thickness distribution is examined by gluing wafers to a polishing plate, measuring thicknesses ($\xi$) of the wax layer at plenty of points aligning two-dimensionally on the wafers and calculating fluctuation of the wax thicknesses. In-wafer wax thickness fluctuation is defined as a difference ($\xi_{max}-\xi_{min}$) between the wax thickness maximum ($\xi_{max}$) and the wax thickness minimum ($\xi_{min}$) within the same wafer. Samples 5, 6, 7, and 8 reveal 3 µm, 3 µm, 7 µm and 8 µm respectively of the in-wafer wax thickness fluctuation.

Inter-wafer wax thickness distribution means the fluctuation of the wax thicknesses of a lot of the wafers glued on the same polishing plate. The inter-wafer is defined as a difference between the maximum wax thickness and the minimum wax thickness of the wafers stuck on a common polishing plate. Measured inter-wax thickness fluctuation is 5 µm, 5 µm, 9 µm and 11 µm for Samples 5, 6, 7 and 8.

Wafer thickness fluctuation denotes the fluctuation of the thicknesses of a wafer. The wafer thickness fluctuation is defined as a difference ($d_{max}-d_{min}$) between the wafer thickness maximum ($d_{max}$) and the wafer thickness minimum ($d_{min}$). Wafer thickness fluctuation measured is 7 µm, 8 µm, 13 µm and 18 µm for Samples 5, 6, 7 and 8 respectively.

Each sample consists of five wafers stuck to a polishing plate. Samples 5, 6, 7 and 8, which are sets of five wafers glued on the polishing plate, are ground, lapped and polished. The Samples 5-8 are ground by a diamond fixed granule whetting turntable. The Samples 5-8 ground are lapped by a metallic whetting turntable with supplying free diamond granules containing liquid. The Samples 5-8 lapped are polished by a resin-pad covered turntable with supplying a liquid including free colloidal silica granules.

Surface roughness of postlap GaN wafers is measured by a photointerference roughness tester. Roughness is measured at five points which are a center and four corners of a square whose center coincides with the center of the postlap wafer. The range of the postlap roughness measured at the five points is listed on Table 2 for Samples 5, 6, 7 and 8.

The postlap surface roughness of Sample 5 is Rms 2.4 to Rms 3.2 nm.

The postlap surface roughness of Sample 6 is Rms 2.1 to Rms 3.5 nm.

The postlap surface roughness of Sample 7 is Rms 2.8 to Rms 4.2 nm.

The postlap surface roughness of Sample 8 is Rms 3.5 to Rms 5.8 nm.

Sample 8 reveals the highest surface roughness of postlap wafers. The large wax thickness fluctuation may invite large postlap surface roughness. Then the lapped wafers of Samples 5-8 are polished into mirror wafers.

Surface roughness of postpolish GaN wafers is measured by the same photointerference roughness tester. Roughness is measured at five points which are a center and four corners of a square whose center coincides with the center of the post-polish wafer. The ranges of the postpolish roughness measured at the five points are listed on Table 2 for Samples 5, 6, 7 and 8.

The postpolish surface roughness of Sample 5 is Rms 1.3 to Rms 1.6 nm.

The postpolish surface roughness of Sample 6 is Rms 1.2 to Rms 1.7 nm.

The postpolish surface roughness of Sample 7 is Rms 1.8 to Rms 3.2 nm.

The postpolish surface roughness of Sample 8 is Rms 2.4 to Rms 3.9 nm.

TABLE 2

|  | Sample 5 | Sample 6 | Sample 7 | Sample 8 |
|---|---|---|---|---|
| Notch facing | inward u | inward u | backward b | backward b |
| In-wafer wax thickness fluctuation | 3 µm | 3 µm | 7 µm | 8 µm |
| Inter-wafer wax thickness fluctuation | 5 µm | 5 µm | 9 µm | 11 µm |
| Substrate thickness fluctuation | 7 µm | 8 µm | 13 µm | 18 µm |
| Postlap surface roughness (Rms) | 2.4~3.2 nm | 2.1~3.5 nm | 2.8~4.2 nm | 3.5~5.8 nm |
| Postpolish surface roughness (Rms) | 1.3~1.6 nm | 1.2~1.7 nm | 1.8~3.2 nm | 2.4~3.9 nm |
| LED yield | 60% | 52% | 32% | 17% |

Sample 8 reveals the highest surface roughness of postpolish wafers. The large wax thickness fluctuation may invite large postpolish surface roughness.

Epitaxial wafers are produced by epitaxially grow n-type GaN films, InGaN films and p-type GaN films on the polished GaN wafers. P-electrodes and n-electrodes are formed on the epitaxial wafers. LEDs are produced by dividing the processed wafers into chips and packaging the chips. Light power and spectrum of LEDs are examined by supplying current, making LEDs lighten and testing emission power and emission spectrum. The LEDs are judged to be approved products or rejects. Yields, which are defined as a ratio of the number of the approved products to the total number, are shown every Sample. A 50 mm diameter wafer can produce about 2000 LED chips of a 400 μm square.

The yields are listed on Table 2. The yields of Samples 5, 6, 7 and 8 are 60%, 52%, 32% and 17%. Large fluctuation of wax thickness invites large wafer thickness fluctuation in Samples 7 and 8. Big wax/wafer thickness fluctuation causes large postlap and postpolish surface roughness Rms in Samples 7 and 8. Samples 7 and 8 are annoyed with low yield which results from the large postpolish roughness Rms and big wafer thickness fluctuation. Comparison of Samples 5, 6, 7 and 8 teaches us that allowable in-wafer wax thickness fluctuation is less than 7 μm and preferable wax thickness fluctuation is less than or equal to 5 μm.

We claim:

1. A method of producing group 3 nitride substrate wafers comprising the steps of:
    preparing a plurality of group 3 nitride substrate wafers having a diameter of 40 mm or more and an orientation flat OF having a length of 2 mm to 30 mm;
    gluing a plurality of group 3 nitride substrate wafers on a bottom of a circular polishing plate with a thermoplastic wax having a thickness of 10 μm or less in a direction of the OF facing forward (f), backward (b) or inward (u) with regard to rotation of the polishing plate; and
    planar-processing surfaces of the group 3 nitride substrate wafers into mirror surfaces with a bevel of a horizontal width (e) less than or equal to 200 μm and a vertical depth (g) less than or equal to 100 μm.

2. A method of producing group 3 nitride substrate wafers comprising the steps of:
    preparing a plurality of group 3 nitride substrate wafers having a diameter of 40 mm or more and a notch having a depth of 2 mm to 10 mm and an angle of 30 degrees to 120 degrees;
    gluing a plurality of group 3 nitride substrate wafers on a bottom of a circular polishing plate with a thermoplastic wax having a thickness of 10 μm or less in a direction of the notch facing forward (f), backward (b) or inward (u) with regard to rotation of the polishing plate; and
    planar processing surfaces of the group 3 nitride substrate wafers into mirror surface with a bevel of a horizontal width (e) less than or equal to 200 μm and a vertical depth less than or equal to 100 μm.

3. The method as claimed in claim 1, wherein a plurality of the group 3 nitride substrate wafers are pasted on the polishing plate along a circle having a center coinciding with a center of the polishing plate; an inner contact circle (j) which is in contact with inner sides of the wafers has a diameter (J) which is more than or equal to 0.35 times as long as the wafer diameter; and a margin (p) between outer sides of the wafers and an edge of the polishing plate is more than or equal to 1 mm.

4. The method as claimed in claim 2, wherein a plurality of the group 3 nitride substrate wafers are pasted on the polishing plate along a circle having a center coinciding with a center of the polishing plate; an inner contact circle (j) which is in contact with inner sides of the wafers has a diameter (J) which is more than or equal to 0.35 times as long as the wafer diameter; and a margin (p) between outer sides of the wafers and an edge of the polishing plate is more than or equal to 1 mm.

5. The method as claimed in claim 1, wherein a plurality of group 3 nitride substrate wafers are pasted on the polishing plate along a circle having a center coinciding with a center of the polishing plate; centers of the wafers are out of a half circle (v) having a diameter (r/2) of half of a diameter (r) of the polishing plate; and a margin (p) between outer sides of the wafers and an edge of the polishing plate is more than or equal to 1 mm.

6. The method as claimed in claim 2, wherein a plurality of group 3 nitride substrate wafers are pasted on the polishing plate along a circle having a center coinciding with a center of the polishing plate; centers of the wafers are out of a half circle (v) having a diameter (r/2) of half of a diameter (r) of the polishing plate; and a margin (p) between outer sides of the wafers and an edge of the polishing plate is more than or equal to 1 mm.

7. The method as claimed in claim 1, wherein a plurality of group 3 nitride substrate wafers are pasted on the polishing plate along two concentric inner and outer circles; and the wafers on the inner circle are not radially aligned with the wafers on the outer circle.

8. The method as claimed in claim 2, wherein a plurality of group 3 nitride substrate wafers are pasted on the polishing plate along two concentric inner and outer circles; and the wafers on the inner circle are not radially aligned with the wafers on the outer circle.

9. The method as claimed in claim 1, wherein the group 3 nitride substrate wafers have an inner stripe structure in which sets of parallel low defect density single crystal regions (Z) and parallel defect accumulating regions (H) reciprocally align in turn.

10. The method as claimed in claim 2, wherein the group 3 nitride substrate wafers have an inner stripe structure in which sets of parallel low defect density single crystal regions (Z) and parallel defect accumulating regions (H) reciprocally align in turn.

11. A group 3 nitride substrate wafer produced by the following method:
    preparing a plurality of group 3 nitride substrate wafers having a diameter of 40 mm or more and an orientation flat OF having a length of 2 mm to 30 mm;
    gluing a plurality of group 3 nitride substrate wafers on a bottom of a circular polishing plate with a thermoplastic wax having a thickness of 10 μm or less in a direction of the OF facing forward (f), backward (b) or inward (u) with regard to rotation of the polishing plate; and
    planar-processing surfaces of the group 3 nitride substrate wafers into mirror surfaces with a bevel of a horizontal width (e) less than or equal to 200 μm and a vertical depth (g) less than or equal to 100 μm.

12. A group 3 nitride substrate wafer produced by the following method:
    preparing a plurality of group 3 nitride substrate wafers having a diameter of 40 mm or more and a notch having a depth of 2 mm to 10 mm and an angle of 30 degrees to 120 degrees;
    gluing a plurality of group 3 nitride substrate wafers on a bottom of a circular polishing plate with a thermoplastic wax having a thickness of 10 μm or less in a direction of the notch facing forward (f), backward (b) or inward (u) with regard to rotation of the polishing plate; and planar-processing surfaces of the group 3 nitride substrate wafers into mirror surfaces with a bevel of a horizontal width (e) less than or equal to 200 μm and a vertical depth less than or equal to 100 μm.

13. The group 3 nitride substrate wafer as claimed in claim 11, wherein a plurality of the group 3 nitride substrate wafers are pasted on the polishing plate along a circle having a center coinciding with a center of the polishing plate; an inner contact circle (j) which is in contact with inner sides of the wafers has a diameter (J) which is more than or equal to 0.35 times as long as the wafer diameter; and a margin (p) between outer sides of the wafers and an edge of the polishing plate is more than or equal to 1 mm.

14. The group 3 nitride substrate wafer as claimed in claim 12, wherein a plurality of the group 3 nitride substrate wafers are pasted on the polishing plate along a circle having a center coinciding with a center of the polishing plate; an inner contact circle (j) which is in contact with inner sides of the wafers has a diameter (J) which is more than or equal to 0.35 times as long as the wafer diameter; and a margin (p) between outer sides of the wafers and an edge of the polishing plate is more than or equal to 1 mm.

15. The group 3 nitride substrate wafer as claimed in claim 11, wherein a plurality of group 3 nitride substrate wafers are pasted on the polishing plate along a circle having a center coinciding with a center of the polishing plate; centers of the wafers are out of a half circle (v) having a diameter (r/2) of half of a diameter (r) of the polishing plate; and a margin (p) between outer sides of the wafers and an edge of the polishing plate is more than or equal to 1 mm.

16. The group 3 nitride substrate wafer as claimed in claim 12, wherein a plurality of group 3 nitride substrate wafers are pasted on the polishing plate along a circle having a center coinciding with a center of the polishing plate; centers of the wafers are out of a half circle (v) having a diameter (r/2) of half of a diameter (r) of the polishing plate; and a margin (p) between outer sides of the wafers and an edge of the polishing plate is more than or equal to 1 mm.

17. The group 3 nitride substrate wafer as claimed in claim 11, wherein a plurality of group 3 nitride substrate wafers are pasted on the polishing plate along two concentric inner and outer circles; and the wafers on the inner circle are not radially aligned with the wafers on the outer circle.

18. The group 3 nitride substrate wafer as claimed in claim 12, wherein a plurality of group 3 nitride substrate wafers are pasted on the polishing plate along two concentric inner and outer circles; and the wafers on the inner circle are not radially aligned with the wafers on the outer circle.

19. The group 3 nitride substrate wafer as claimed in claim 11, wherein the group 3 nitride substrate wafers have an inner stripe structure in which sets of parallel low defect density single crystal regions (Z) and parallel defect accumulating regions (H) reciprocally align in turn.

20. The group 3 nitride substrate wafer as claimed in claim 12, wherein the group 3 nitride substrate wafers have an inner stripe structure in which sets of parallel low defect density single crystal regions (Z) and parallel defect accumulating regions (H) reciprocally align in turn.

* * * * *